(12) United States Patent
Lee et al.

(10) Patent No.: US 9,274,151 B2
(45) Date of Patent: Mar. 1, 2016

(54) FAST WIDEBAND FREQUENCY COMPARATOR

(71) Applicant: ELECTRONICS AND TELECOMMUNICATIONS RESEARCH INSTITUTE, Daejeon (KR)

(72) Inventors: Hui Dong Lee, Daejeon (KR); Jae Ho Jung, Daejeon (KR)

(73) Assignee: ELECTRONICS AND TELECOMMUNICATIONS RESEARCH INSTITUTE, Daejeon (KR)

( * ) Notice: Subject to any disclaimer, the term of this patent is extended or adjusted under 35 U.S.C. 154(b) by 508 days.

(21) Appl. No.: 13/687,200

(22) Filed: Nov. 28, 2012

(65) Prior Publication Data
US 2013/0147462 A1 Jun. 13, 2013

(30) Foreign Application Priority Data
Dec. 7, 2011 (KR) .......................... 10-2011-0130542

(51) Int. Cl.
*G01R 23/00* (2006.01)
(52) U.S. Cl.
CPC .............. *G01R 23/00* (2013.01); *G01R 23/005* (2013.01)
(58) Field of Classification Search
CPC ....................................................... G01R 23/00

USPC .......................................................... 237/39
See application file for complete search history.

(56) References Cited

U.S. PATENT DOCUMENTS

| 7,378,880 B2 * | 5/2008 | Han et al. .................. 327/43 |
| 8,368,472 B2 * | 2/2013 | Nakamura et al. .............. 331/34 |
| 2004/0092242 A1 * | 5/2004 | Endo ............................... 455/264 |
| 2005/0215221 A1 * | 9/2005 | Fujita ............................. 455/260 |
| 2007/0257709 A1 * | 11/2007 | Han et al. ...................... 327/39 |
| 2008/0310221 A1 * | 12/2008 | Baker ......................... 365/185.2 |
| 2011/0260762 A1 * | 10/2011 | Choi et al. .................... 327/156 |

FOREIGN PATENT DOCUMENTS

KR 10-2010-0039003 A 4/2010

OTHER PUBLICATIONS

Kun-Seok Lee et al., "Fast AFC technique using a code estimation and binary search algorithm for wideband frequency synthesis", Proceedings of ESSCIRC, Grenoble, France, 2005, pp. 181-184, IEEE.

* cited by examiner

*Primary Examiner* — Alesa Allgood

(57) ABSTRACT

A frequency comparator outputs an input reference signal and a comparison target signal as pulse-form signals, and is charged or discharged with a voltage corresponding to the reference signal to output a reference voltage having a variable first frequency range, and charged or discharged with a voltage corresponding to the comparison target signal to output a comparison target voltage having a variable second frequency range. The frequency comparator compares the reference voltage having the first frequency range and the comparison output voltage having the second frequency range.

20 Claims, 6 Drawing Sheets

FAST WIDEBAND FREQUENCY COMPARATOR

CROSS-REFERENCE TO RELATED APPLICATION

This application claims priority to and the benefit of Korean Patent Application No. 10-2011-0130542 filed in the Korean Intellectual Property Office on Dec. 7, 2011, the entire contents of which are incorporated herein by reference.

BACKGROUND OF THE INVENTION (a) Field of the Invention

The present invention relates to a fast wideband frequency comparator.

(b) Description of the Related Art

As next generation mobile communication systems continue to progress, systems that operate faster and in a broadband range are being actively developed. Thus, much research is being conducted on technologies for quickly generating a clock signal and quickly finding a desired band. One of the essential parts of this research is a frequency comparator.

A conventional frequency comparator will be discussed below.

The conventional frequency comparator compares the frequency of a target signal with the frequency of a reference signal to determine whether the frequency of the target signal is fast or slow. To this end, two counters are used to compare the frequencies of two signals. The first counter operates using a target signal as a clock signal, and the second counter operates using a reference signal as a clock signal. When one of the two counters reaches a preset value, a comparison process using the comparator is performed to output a corresponding comparison signal.

In the case of frequency comparison using these counters, however, it takes several tens of microseconds to obtain a comparison result of the frequencies of two signals, which is quite long. Moreover, it is necessary to increase the number of counter bits for higher comparison accuracy. Therefore, the conventional frequency counter is not appropriate for a wireless communication system requiring fast operations.

The above information disclosed in this Background section is only for enhancement of understanding of the background of the invention and therefore it may contain information that does not form the prior art that is already known in this country to a person of ordinary skill in the art.

SUMMARY OF THE INVENTION

The present invention has been made in an effort to provide a frequency comparator having the advantage of comparing a target signal with a reference signal faster and more accurately.

An exemplary embodiment of the present invention provides a frequency comparator including: a pulse generation unit that outputs an input reference signal and a comparison target signal as pulse-form signals; a capacitor unit that is charged or discharged with a voltage corresponding to the reference signal output from the pulse generation unit to output a reference voltage having a variable first frequency range, and charged or discharged with a voltage corresponding to the comparison target signal output from the pulse generation unit to output a comparison target voltage having a variable second frequency range; and a voltage comparison unit that compares the reference voltage and the comparison output voltage, which are output from the capacitor unit, to output a comparison result signal.

The capacitor unit may include: at least one first capacitor; a first switch that operates in response to the reference signal output from the pulse generation unit, and that charges or discharges a voltage corresponding to the reference signal to or from the first capacitor; at least one second capacitor; and a second switch that operates in response to the comparison target signal output from the pulse generation unit, and that charges or discharges a voltage corresponding to the comparison target signal to or from the second capacitor.

The first capacitor may be provided as a plurality of first capacitors connected in parallel with each other, and the second capacitor may be provided as a plurality of second capacitors connected in parallel with each other, and the capacitor unit may further include: a plurality of third switches connected in series, corresponding to the first capacitors; and a plurality of fourth switches connected in series, corresponding to the second capacitors. The first frequency range of the reference voltage may vary as the first capacitors are charged or discharged, and the second frequency range of the comparison target voltage may vary as the second capacitors are charged or discharged.

Another embodiment of the present invention provides a frequency comparator including: a reference signal generation unit that generates a reference signal having a reference frequency based on an externally input signal and outputs the same to a pulse generation unit; the pulse generation unit that outputs an externally input comparison target signal and the reference signal output from the reference signal generation unit as pulse-form signals; a capacitor unit including a plurality of first capacitors that are charged or discharged with a voltage corresponding to the reference signal output from the pulse generation unit to output a reference voltage and a plurality of second capacitors that are charged or discharged with a voltage corresponding to the comparison target signal output from the pulse generation unit to output a comparison target voltage; and a voltage comparison unit that compares the reference voltage and the comparison output voltage, which are output from the capacitor unit, to output a comparison result signal, wherein the plurality of first capacitors are connected in parallel with each other, and the first frequency range of the reference voltage may vary as the first capacitors are charged or discharged, and the plurality of second capacitors are connected in parallel with each other, and the second frequency range of the comparison target voltage may vary as the second capacitors are charged or discharged.

The capacitor unit may further include: a plurality of first switches connected in series, corresponding to the first capacitors; and a plurality of second switches connected in series, corresponding to the second capacitors.

The capacitor unit may further include: an operator that performs a logical operation on the reference signal and the comparison target signal, which are output from the pulse generation unit, to output a corresponding operation signal; a third switch that charges a voltage corresponding to the reference signal in the first capacitors in accordance with the operation signal; a fourth switch that charges a voltage corresponding to the target comparison signal in the second capacitors in accordance with the operation signal; a fifth switch that operates in accordance with the reference signal output from the pulse generation unit and forms a discharge path of the voltage charged in the first capacitors; and a sixth switch that operates in accordance with the reference signal output from the pulse generation unit and forms a discharge path of the voltage charged in the first capacitors.

The frequency comparator according to an embodiment of the present invention may further include a current source/sink unit for supplying or drawing current to or from the capacitor unit.

The current source/sink unit may include a current sink unit including a plurality of current sources connected to a power supply voltage or ground voltage, and a plurality of seventh switches connected in series, corresponding to the plurality of current sources. As current output from the capacitor unit is supplied to the power supply or ground via the current sources according to the operation of the seventh switches, the first frequency range of the reference voltage output from the capacitor unit may vary, and the second frequency range of the comparison target voltage may vary.

The voltage comparator may further include: a reference signal generation unit that generates a reference signal having a reference frequency based on an externally input signal and outputs it to the pulse generation unit; and a register unit that stores a comparison result signal output from the voltage comparison unit.

The capacitor unit may further include a leakage current compensator for compensating a leakage current component.

DETAILED DESCRIPTION OF THE EMBODIMENTS

Figure 1:
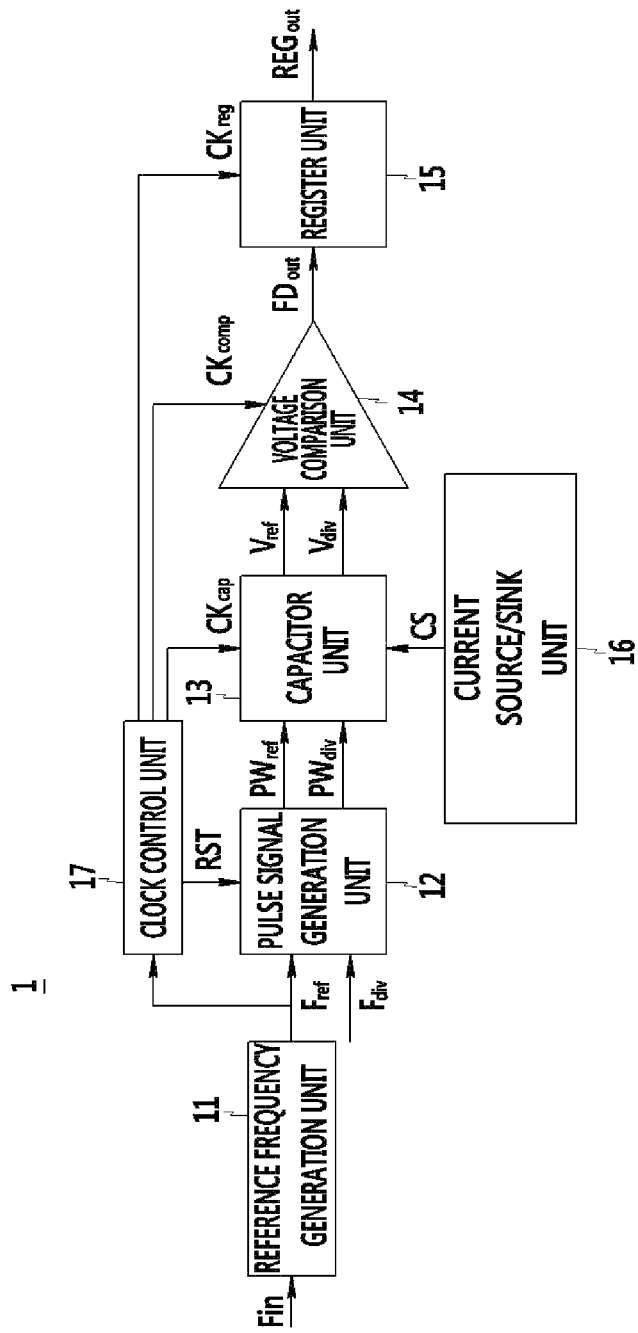
FIG. 1 is a view showing a structure of a fast wideband frequency comparator according to an exemplary embodiment of the present invention.

In the following detailed description, only certain exemplary embodiments of the present invention have been shown and described, simply by way of illustration. As those skilled in the art would realize, the described embodiments may be modified in various different ways, all without departing from the spirit or scope of the present invention.

Accordingly, the drawings and description are to be regarded as illustrative in nature and not restrictive. Like reference numerals designate like elements throughout the specification.

Throughout this specification and the claims that follow, unless explicitly described to the contrary, the words "comprise" and "include" and variations such as "comprises", "comprising", "includes", or "including" will be understood to imply the inclusion of stated elements but not the exclusion of any other elements.

Now, a fast wideband frequency comparator according to an exemplary embodiment of the present invention will be described.

FIG. 1 is a view showing a structure of a fast wideband frequency comparator according to an exemplary embodiment of the present invention.

As shown in the attached FIG. 1, the fast wideband frequency comparator 1 according to the exemplary embodiment of the present invention includes a reference frequency generation unit 11, a pulse generation unit 12, a capacitor unit 13, a voltage comparison unit 14, a register unit 15, a current source/sink unit 16, and a clock control unit 17.

The reference frequency generation unit 11 outputs a reference signal $F_{ref}$ having a reference frequency based on an externally input signal $F_{in}$. For example, the reference signal $F_{ref}$ is output by multiplying or dividing the frequency of an input signal $F_{in}$ or by passing the frequency of an input signal. In general, the frequency of the input signal $F_{in}$ needs to be multiplied in order to make the frequency comparator operate at a high speed. However, if the frequency of the input signal $F_{in}$ is several hundreds of MHz or several GHz or higher, the signal may be divided or passed in order to comply with the processing speed of the frequency comparator.

Specifically, the pulse generation unit 12 converts a clock signal for a predetermined period based on two input signals, and outputs it in a pulse form. Specifically, the reference signal $F_{ref}$ input from the reference frequency generation unit 11 and an externally input target signal $F_{div}$ (hereinafter referred to as a comparison target signal for the convenience of explanation) are processed and output in a pulse form signal. For example, a pulse for one period can be generated every four periods of the reference signal $F_{ref}$ and the comparison target signal $F_{div}$, whereby a pulse-form reference signal $PW_{ref}$ and a pulse-form comparison target signal $PW_{div}$ are output. The pulse generation unit 12 is disabled in accordance with a reset signal RST input from the clock control unit 17.

The clock control unit 17 generates clock signals $CK_{cap}$, $CK_{comp}$, and $CK_{reg}$ based on the reference signal $F_{ref}$ input from the reference frequency generator 11, and provides them to their corresponding elements. That is, the clock control unit 17 provides corresponding clock signals to the pulse generation unit 12, the capacitor unit 13, the voltage comparison unit 14, and the register unit 15, and may also provide a corresponding clock signal to the current source/sink unit 16.

Also, the clock control unit 17 generates a reset signal RST and provides it to the pulse generation unit 12.

The capacitor unit 13 charges or discharges electrical charges to or from capacitors. Specifically, the capacitor unit 13 receives a pulse-form reference signal $PW_{ref}$ and a pulse-form comparison target signal $PW_{div}$ from the pulse generation unit 12, and is charged or discharged with the input signals to output signals $V_{ref}$ and $V_{div}$ having a constant voltage.

Figure 2:
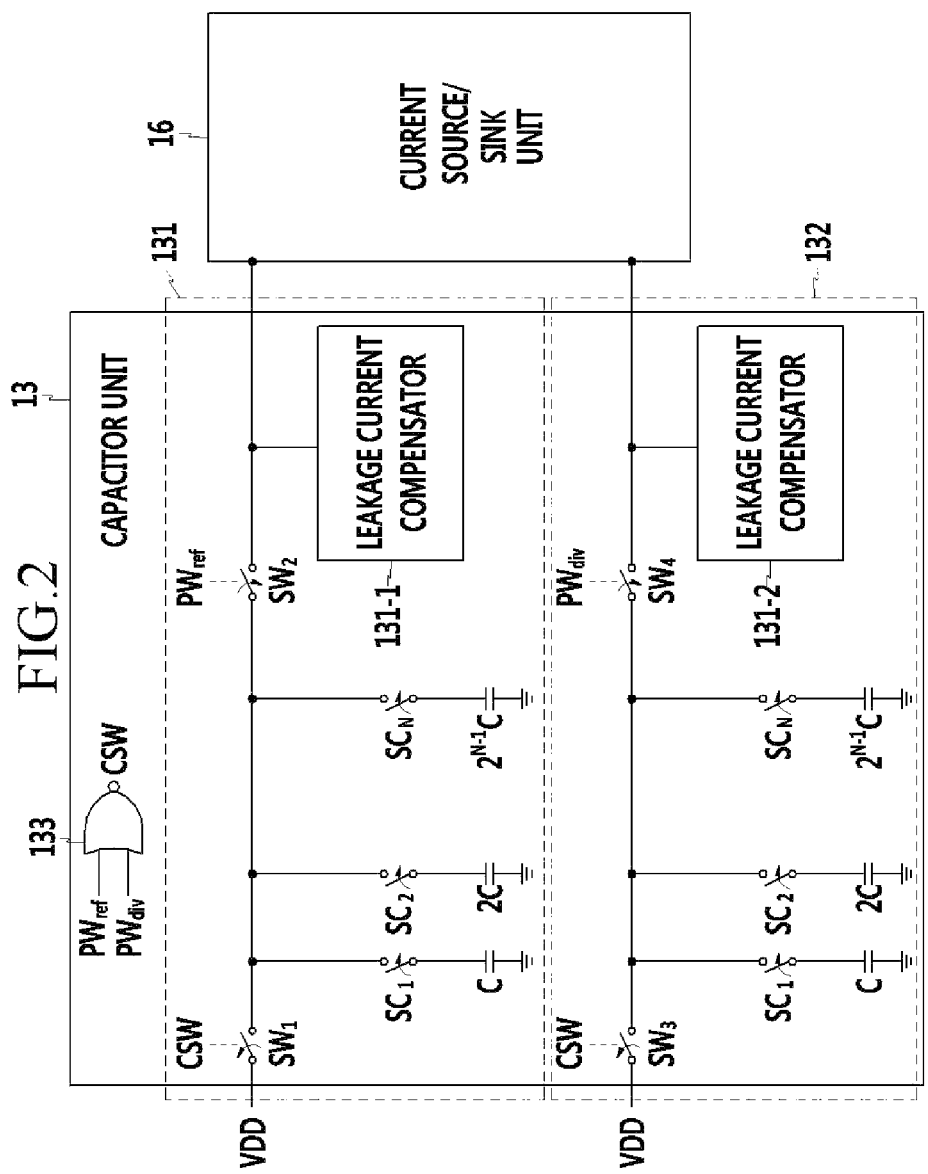
FIG. 2 is a view showing a structure of a capacitor unit according to the exemplary embodiment of the present invention.

FIG. 2 is a view showing a structure of a capacitor unit according to the exemplary embodiment of the present invention.

As shown in the attached FIG. 2, the capacitor unit 13 according to the exemplary embodiment of the present invention includes a first capacitor unit 131 to be charged or discharged with a pulse-form reference signal $PW_{ref}$, a second capacitor unit 132 to be charged or discharged with a pulse-form comparison target signal $PW_{div}$, and an operator 133 for performing a logical operation on the reference signal $PW_{ref}$ and the comparison target signal $PW_{div}$. The operator 133 performs logical operation, i.e., a negative OR operation, on the reference signal $PW_{ref}$ and the comparison target signal $PW_{div}$, and outputs a corresponding operation signal CSW.

The first capacitor unit 131 includes a switch $SW_1$ to be switched on by an input operation signal CSW, a plurality of switches $SC_1$, $Sc_2$, ..., $SC_N$ connected in parallel with the switch $SW_1$, a plurality of capacitors C, 2C, ..., $2^{N-1}C$ connected in series with the plurality of switches $SC_1$, $Sc_2$, ..., $SC_N$, respectively, and connected in parallel with each other, a switch $SW_2$ to be switched on by an input reference signal $PW_{re}$, and a leakage current compensation unit 131-1. The switch $SW_1$ and the switch $SW_2$ operate opposite to each other. For example, while the switch $SW_1$ is switched on by a high-level signal, the switch $SW_2$ is switched on by a low-level signal. An interval exists during which the switch $SW_1$ and the switch $SW_2$ are simultaneously switched off.

The second capacitor unit 132 includes a switch $SW_3$ to be switched on by an input operation signal CSW, a plurality of switches $SC_1$, $Sc_2$, ..., $SC_N$ connected in parallel with a switch $SW_3$, a plurality of capacitors C, 2C, ..., $2^{N-1}C$ connected in series with the plurality of switches $SC_1$, $Sc_2$, ..., $SC_N$, respectively, and connected in parallel with each other, a switch $SW_4$ to be switched on by an input comparison target signal $PW_{div}$, and a leakage current compensation unit 132-1. The switch $SW_3$ and the switch $SW_4$ operate opposite to each other. For example, while the switch $SW_3$ is switched on by a high-level signal, the switch $SW_4$ is switched on by a low-level signal. Likewise, an interval exists during which the switch $SW_3$ and the switch $SW_4$ are simultaneously switched off.

The capacitor unit 13 having such a structure can charge and discharge capacitors by means of the current source/sink unit 16, or may either charge or discharge it. As shown in FIG. 2, a description will be made with respect to an example in which capacitors are electrically discharged by means of the current source/sink unit 16. The current source/sink unit 16 sinks electric current from the capacitor unit 13 with a given current value.

Referring to FIG. 2, a description will be made with respect to a case where the switches $SC_1$ to $SC_N$ and the capacitors 2C to $2^{N-1}C$ do not exist and the capacitor C is directly connected to nodes $V_{ref}$ and $V_{div}$ at one side.

When the operation signal CSW, generated by a negative OR operation of the reference signal $PW_{ref}$ input from the pulse generation unit 12 and the comparison target signal $PW_{div}$, is output at a high level, the switches $SW_1$ and $SW_3$ are placed in the closed state (i.e., ON state), and the voltages $V_{ref}$ and $V_{div}$ applied to both ends of the capacitors C of the first and second capacitor units 131 and 132 are charged to a VDD voltage. In this state, when the operation signal CSW is output at a low level, the switches $SW_1$ and $SW_3$ are simultaneously placed in the open state (i.e., OFF state). The voltages $V_{ref}$ and $V_{div}$ applied to both ends of the capacitors C are maintained at VDD until the reference signal $PW_{ref}$ and the comparison target signal $PW_{div}$ become the high level.

Because the frequency comparator operates based on the reference signal $F_{ref}$ indicative of the signal characteristics, the pulse-form comparison target signal $PW_{div}$ becomes high level first, and the pulse-form reference signal $PW_{ref}$ becomes high level later. On the contrary, the signals may be processed based on the comparison target signal $F_{div}$.

According to this characteristic, when the pulse-form comparison target signal $PW_{div}$ becomes high level, the switch $SW_2$ is opened and the switch $SW_4$ is closed, in response to a low-level operation signal CSW, and the electrically charged capacitor C of the second capacitor unit 132 starts to be discharged. In this case, the voltage $V_{div}$ applied to the capacitor C of the second capacitor unit 132 is lowered until the pulse-form comparison target signal $PW_{div}$ becomes low level.

Subsequently, the operation signal CSW becomes low level as soon as the reference signal $PW_{ref}$ becomes high level. Therefore, the switch $SW_1$ is opened and the switch $SW_3$ is closed, and the electrically charged capacitor C of the first capacitor unit 131 starts to be discharged. In this case, the voltage $V_{ref}$ applied to the capacitor C of the first capacitor unit 131 is lowered until the pulse-form reference signal $PW_{ref}$ becomes low level.

After waiting until both the reference signal $PW_{ref}$ and the comparison target signal $PW_{div}$ become low level, the voltage applied to the capacitor C of the first capacitor unit 131, i.e., the reference voltage $V_{ref}$ corresponding to the reference signal, and the voltage applied to the capacitor C of the second capacitor unit 132, i.e., the comparison target voltage $V_{div}$ corresponding to the comparison target signal, are compared.

At this point, it is crucial that the voltages $V_{ref}$ and $V_{div}$ applied to the respective capacitors are maintained as is until voltage comparison. Usually, the comparison target voltage $V_{div}$ corresponding to the comparison target signal starts to be lowered first and reaches a given value first. This is because the signals are processed based on the reference signal $F_{ref}$ corresponding to the reference frequency. In this case, the voltage of the comparison target voltage $V_{div}$ has to be maintained until the reference voltage $V_{ref}$ reaches a given voltage. In actual circuit implementation, however, the voltage may not be maintained due to a leakage current. To overcome this, the capacitor unit 13 according to the exemplary embodiment of the present invention includes the leakage current compensation units 131-1 and 131-2 respectively provided in the capacitor units 131 and 132, as shown in FIG. 2. The leakage current compensation units 131-1 and 132-1 may measure an amount of leakage current and source the same amount of current while the voltage is maintained at a constant value or digitize the voltage value using an ADC (analog to digital converter). If the amount of leakage current is equal to or less than a negligible value, for example, a set value, leakage current compensation can be omitted.

The timing of making a comparison between the reference voltage $V_{ref}$ and the comparison target signal $V_{div}$, which are output from the capacitor unit 13 having the above-described structure, may be consistent with the timing when the capacitors C are charged again to VDD. Thus, a slight time delay may be introduced during the outputting of the operator 133.

As shown in FIG. 1, the voltage comparison unit 14 compares the reference voltage $V_{ref}$ and the comparison target voltage $V_{div}$, which are output from the capacitor unit 13, in accordance with the clock signal $CK_{comp}$ input from the clock control unit 17, and outputs a corresponding comparison result signal. For example, if the reference voltage $V_{ref}$ is higher than the comparison target voltage $V_{div}$, a high-level comparison result signal $FD_{out}$ is output, and if the reference voltage $V_{ref}$ is lower than the comparison target voltage $V_{div}$, a low-level comparison result signal $FD_{out}$ is output. Of course, the comparison result signal $FD_{out}$ may have an opposite output value.

The comparison between the two voltages is made at a point in time when the reference voltage $V_{ref}$ and the comparison target voltage $V_{div}$ are maintained at a constant value after the discharging of the capacitors C. In actual circuit implementation, an operating range of the voltage comparison unit 14 is configured, and at least one of an input reference voltage $V_{ref}$ and an input comparison target voltage $V_{div}$ have to be within the operating range of the voltage comparison unit 14. If both the reference voltage $V_{ref}$ and the comparison target voltage $V_{div}$ are out of the operating range of the voltage comparison unit 14, normal output values cannot be obtained.

Figure 3:
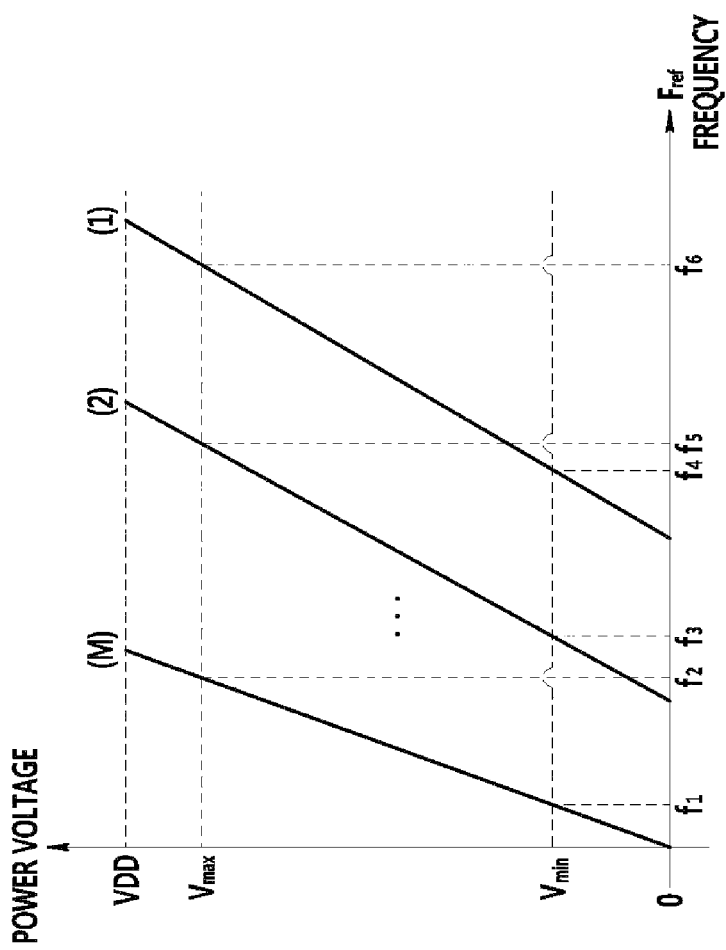
FIG. 3 is a graph showing the voltage characteristics of a voltage comparison unit according to the exemplary embodiment of the present invention.

FIG. 3 is a graph showing the voltage characteristics of a voltage comparison unit according to the exemplary embodiment of the present invention. The attached FIG. 3 depicts operating range of voltages input into the voltage comparison unit 14 versus reference frequency $F_{ref}$ characteristics. Although FIG. 3 illustrates the voltages as being linear, the voltages may be in the form of monotonically increasing curves. In an entirely contrary case, the voltages may have a negative slope.

For a voltage curve 1 illustrated in FIG. 3, the operating range of the voltage comparison unit 14 extends from a minimum voltage $V_{min}$ to a maximum voltage $V_{max}$. On the voltage curve 1, if the reference signal $F_{ref}$ has a frequency range of f5 to f6, the voltage comparison unit 14 is able to properly perform a comparison operation. If out of this range, the voltage comparison unit 14 is not operable.

Meanwhile, in FIG. 1, the register unit 15 stores an output from the voltage comparison unit 14, i.e., the comparison result signal $FD_{out}$. Specifically, the register unit 15 stores the comparison result signal $FD_{out}$ in synchronization with the clock signal $CK_{ref}$ provided from the clock control unit 17. The register unit 15 stores the output from the voltage comparison unit 14 obtained for a predetermined period of time. Thereafter, it produces the output from the voltage comparison unit 14 stored for a predetermined period of time after the frequency of the comparison target signal $F_{div}$ is changed. The comparison result signal $FD_{out}$ from the voltage comparison unit 14, obtained and stored for a predetermined period of time, can be converted and output in a parallel data form.

The current source/sink unit 16 serves to supply or draw current to or from the capacitor unit 13.

Figure 4:
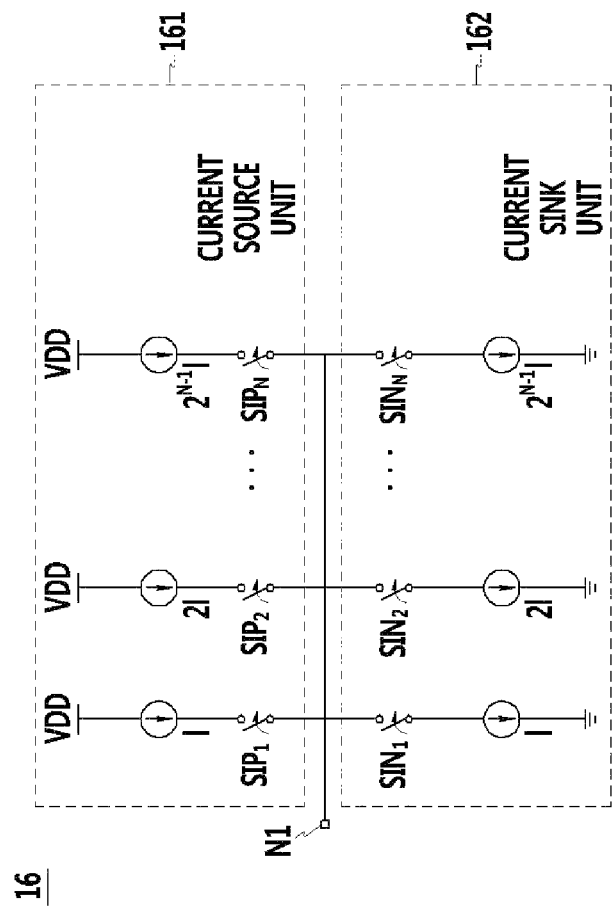
FIG. 4 is a view showing a structure of a current source/sink unit according to the exemplary embodiment of the present invention.

FIG. 4 is a view showing a structure of a current source/sink unit according to the exemplary embodiment of the present invention.

As shown in FIG. 4, the current source/sink unit 16 according to the exemplary embodiment of the present invention includes a current source unit 161 and a current sink unit 162, or it may include either one of the two. That is, the current source/sink unit 16 may include the current source unit 161 alone or the current sink unit 162 alone, or may include both of the current source unit 161 and the current sink unit 162.

The current source unit 161 includes a plurality of current sources I, 2I, ..., $2^{N-1}$I connected to a power supply VDD and a plurality of switches $SIP_1$, $SIP_2$, ..., $SIP_N$, and the current sink unit 162 includes a plurality of current sources I, 2I, ..., $2^{N-1}$I connected to a ground and a plurality of switches $SIN_1$, $SIN_2$, ..., $SIN_N$. The plurality of switches $SIP_1$, $SIP_2$, ..., $SIP_N$ may be connected corresponding to the plurality of switches $SIN_1$, $SIN_2$, ..., $SIN_N$.

For example, a description will be made with respect to a case where the current source/sink unit 16 includes the current sink unit 162 alone. It is assumed that only the switches $SIN_1$ to $SIN_N$ and the current sources 2I-$2^{N-1}$I exist. Thus, only the current source I of the current sink unit 162 is connected to an input node N1. The input node N1 is connected to the capacitor unit 13, and only the current source I continues to draw current I from the input node N1 by predetermined amounts. In this case, a voltage output from the capacitor 13 may have such a characteristic as shown in FIG. 3. As mentioned above, the voltage does not need to have a linear characteristic, but has to show a monotonic increase.

A voltage input into the voltage comparison unit 14 is determined depending on the frequency of two substantially input signals $F_{ref}$ and $F_{div}$ and the value of the current source I. Only the signal $F_{ref}$ having a frequency of f5 to f6 within the operating range of the voltage comparison unit 14 is operable.

In the above-described frequency comparator 1 according to the exemplary embodiment of the present invention, the range of a target frequency may be limited because of the operating range of the voltage comparison unit 14.

Accordingly, the exemplary embodiment of the present invention uses a method of changing the frequency of an input signal $F_{in}$ to have a frequency range of the comparison target signal $F_{div}$ by means of the reference frequency generation unit 11. Using this method, the frequency range of the input signal $F_{in}$ is prevented from being limited.

In some cases, this method may not be available. If so, the operating frequency range of the reference signal $F_{ref}$ can be extended by extending the operating range of the voltage comparison unit 14 of the comparator by using the following method for the reference signal $F_{ref}$ output from the reference frequency generation unit 11.

More specifically, as shown in FIG. 2, if both the switches $SC_1$-$SC_N$ and the capacitors C to $2^{N-1}$C exist in the capacitor unit 13, the capacitors C to $2^{N-1}$C are charged or discharged in accordance with the operation signal CSW, the pulse-form reference signal $PW_{ref}$ output from the pulse generation unit 12, and the comparison target signal $PW_{div}$, and output constant voltages, i.e., the reference voltage $V_{ref}$ and the comparison target voltage $V_{div}$, as stated above.

Additionally, the voltage curves (2), ..., (M), as well as the voltage curve (1), are activated in the graph of FIG. 3 according to the switching operations of the switches $SC_1$ to $SC_N$. As a result, the input frequency range of the reference signal $F_{ref}$ can be extended from f1 to f6.

The capacitor unit 13 that is capable of extending the frequency range using the switches $SC_1$ to $SC_N$ and the capacitors C to $2^{N-1}$C may also be referred to as a variable capacitor unit.

Further, the input frequency range of the reference signal $F_{ref}$ can be extended by means of the current source/sink unit 16.

Specifically, if both the switches $SIN_1$-$SIN_N$ and current sources 2I to $2^{N-1}$I of the current sink unit 162 exist in the current source/sink unit 162 having such a structure as shown in FIG. 4, the voltage curves (2), ..., (M), as well as the voltage curve (1), are activated in the graph of FIG. 3 according to additional switching operations of the switches $SIN_1$-$SIN_N$. As a result, the input frequency range of the reference signal $F_{ref}$ can be extended from f1 to f6.

The current source/sink unit 16 that is capable of extending the frequency range using the switches $SIN_1$ to $SIN_N$ and the current sources 2I to $2^{N-1}$I may ma also be referred to as a variable current/source sink unit.

Figure 5:
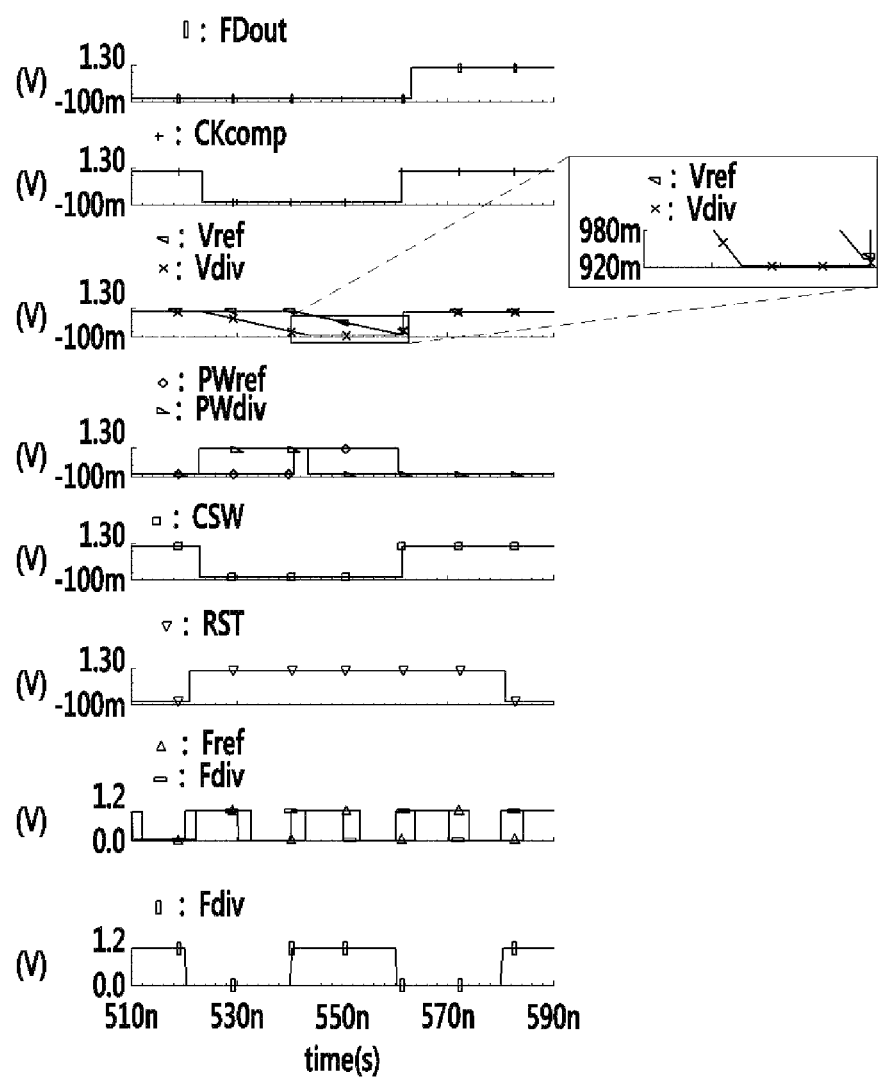
FIG. 5 is an exemplary view showing output waveforms of signals of the frequency comparator according to the exemplary embodiment of the present invention.

FIG. 5 is an exemplary view showing output waveforms of signals of the frequency comparator according to the exemplary embodiment of the present invention.

It is assumed that the frequency comparator 1 according to the exemplary embodiment of the present invention uses and outputs the signals exemplified in FIG. 5. To this end, for example, the reference frequency generation unit 11 doubles the frequency of an input signal $F_{in}$ to output a reference signal $F_{ref}$, and the pulse generation unit 12 outputs a pulse signal for one period every four periods of an input reference signal $F_{ref}$ and an input comparison target signal $F_{div}$. The capacitor unit 13 includes only capacitors C, and the current source/sink unit 16 includes only the current sink unit 162 and uses only a single current source I.

In this state, the clock control unit 17 supplies a clock signal to each of the components, and the reference frequency generation unit 11 receives an input signal $F_{in}$ having a frequency of 20 MHz and doubles it to thus output a reference signal $F_{ref}$ having a frequency of 40 MHz. The pulse generation unit 12 outputs a pulse signal $PW_{ref}$ for one period every four periods of an input reference signal $F_{ref}$ and also outputs a pulse signal $PW_{div}$ for one period every four periods of an input comparison target signal $F_{div}$.

A reference voltage $V_{ref}$ and a comparison target voltage $V_{div}$ corresponding to the pulse-form signals $PW_{ref}$ and $PW_{div}$ are charged, as a VDD voltage, in the capacitor unit 13, and lowered from the VDD voltage. When the reference voltage $V_{ref}$ and the comparison target voltage $V_{div}$ have a given voltage by the charging or discharging of the capacitor unit 13, the voltage comparison unit 14 operates in accordance with a clock signal $CK_{comp}$ to thus output a comparison result signal $FD_{out}$.

Specifically, as shown in FIG. 5, when the clock signal $CK_{comp}$ changes from a low level to a high level rising edge, the comparison result signal $FD_{out}$ is output at a high level, for example, "1" because the reference voltage $V_{ref}$ is greater than the comparison target voltage $V_{div}$.

In the thusly operating frequency comparator 1, it can be seen that the pulse-form signals PWref and PWdiv are not synchronized with each other, as shown in FIG. 5. An operation signal CSW is generated by performing a negative OR operation on these signals PWref and PWdiv. In the pulse generator 12, a reset signal RST is activated at a low level, and is therefore maintained at a high level during pulse generation and during a comparison operation.

In the frequency comparator 1 operating based on the signals having such forms as shown in FIG. 5, it took approximately "4(period)×25 ns=100 ns" to compare the frequencies of the signals. It takes approximately "4(period)×50 ns=200 ns" to generate a reference signal unless an input signal is doubled. Therefore, the frequency comparator 1 according to the exemplary embodiment of the present invention can achieve a faster comparison and detection operation by doubling the frequency of an input signal.

Figure 6:
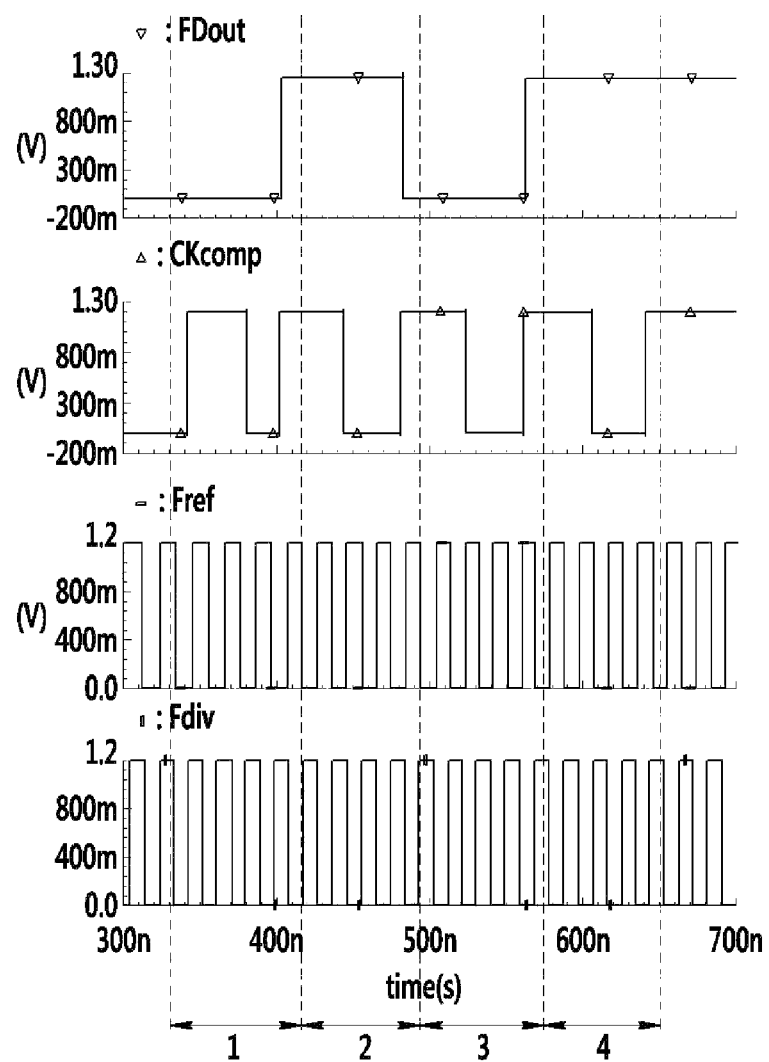
FIG. 6 is an exemplary view showing other output waveforms of signals of the frequency comparator according to the exemplary embodiment of the present invention.

FIG. 6 is an exemplary view showing other output waveforms of signals of the frequency comparator according to the exemplary embodiment of the present invention, which shows, in particular, the characteristics of continuous comparison in the frequency comparator 1. Here, a comparison operation is performed four times.

It is assumed that the frequency comparator 1 according to the exemplary embodiment of the present invention uses and outputs such signals as exemplified in FIG. 6. It is to be noted that the same condition as when the signals of FIG. 5 are used is established. Particularly, the frequency comparator is adapted to a phase-locked loop automatic frequency control circuit by way of example.

Referring to FIG. 6, the clock signal $CK_{comp}$ of the clock control unit 17 shows four rising edges because it uses a 4-bit code. It can be confirmed that the clock signal $CK_{comp}$ is generated every four periods of a reference signal $F_{ref}$.

It can be seen that a comparison result signal $FD_{out}$ is output from the voltage comparison unit 14 in accordance with the clock signal $CK_{comp}$, and the value of the comparison result signal $FD_{out}$ is output sequentially in the order of high level, low level, high level, and low level.

In the phase-locked loop, it can be seen that the frequency comparator according to the exemplary embodiment of the present invention continuously operates faster and more accurately. As such, it is possible to realize a frequency comparator which allows the above-stated reference signal generation unit 11, variable capacitor unit 13, and variable current source/sink unit 14 to operate within a wideband frequency range.

Such a frequency comparator according to the exemplary embodiment of the present invention can have a fast wideband operating range. Moreover, the frequency comparator according to the exemplary embodiment of the present invention can be easily adapted to a circuit, such as a phase-locked loop, a frequency synthesizer, etc.

Furthermore, in the exemplary embodiment of the present invention, there is no need to perform synchronization between a reference signal and a comparison target signal, and therefore no particular time or element is required for synchronization. In addition, a predetermined count value for a frequency accuracy counter does not need to be set high because no counter is used, thereby achieving a faster comparison and detection operation.

According to an exemplary embodiment of the present invention, a target signal and a reference signal can be compared and detected faster. Moreover, a frequency comparator or detector having a fast wideband operating range can be attained. Particularly, a frequency comparator having a simple structure can be attained.

While this invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A frequency comparator comprising:
   a pulse generation unit that outputs a reference signal and a comparison target signal as pulse-form signals;
   a capacitor circuit including:
      an operator performing a logical NOR operation on the reference signal and the comparison target signal to output an operation signal, the operation signal being a result of the NOR operation of the reference signal and the comparison target signal; and
      first and second capacitor units, the first and second capacitor units being charged according to the operation signal, the first capacitor unit being discharged according to the reference signal output from the pulse generation unit to output a reference voltage having a variable first frequency range, the second capacitor unit being discharged according to the comparison target signal output from the pulse generation unit to output a comparison target voltage having a variable second frequency range; and
   a voltage comparison unit that compares the reference voltage and the comparison output voltage, which are output from the capacitor circuit, to output a comparison result signal.

2. The frequency comparator of claim 1, wherein the capacitor circuit further includes:
   a first switch that operates in response to the reference signal output from the pulse generation unit, and that discharges the first capacitor unit;
   a second switch that operates in response to the comparison target signal output from the pulse generation unit, and that discharges the second capacitor unit.

3. The frequency comparator of claim 2, wherein the first capacitor unit includes a plurality of first capacitors connected in parallel with each other, and the second capacitor unit includes a plurality of second capacitors connected in parallel with each other, and
   wherein the capacitor circuit further includes:
   a plurality of third switches each connected in series to a corresponding one of the first capacitors; and
   a plurality of fourth switches each connected in series to a corresponding one of the second capacitors.

4. The frequency comparator of claim 3, wherein the first frequency range of the reference voltage varies as the first capacitors are charged or discharged, and the second frequency range of the comparison target voltage varies as the second capacitors are charged or discharged.

5. The frequency comparator of claim 2, wherein the capacitor circuit further includes:
a fifth switch coupled to and disposed between a power supply terminal and the first capacitor unit and controlling the charging of the first capacitor unit in accordance with the operation signal; and
a sixth switch coupled to and disposed between the power supply terminal and the second capacitor unit and controlling the charging of the second capacitor unit in accordance with the operation signal.

6. The frequency comparator of claim 5, wherein the first and second capacitor units are charged to a level of the power supply terminal.

7. The frequency comparator of claim 1, further comprising a current source/sink unit supplying or drawing a current to or from the capacitor circuit.

8. The frequency comparator of claim 7, wherein the current source/sink unit comprises a current sink unit, which includes a plurality of current sources each connected to a power supply terminal or ground terminal, and a plurality of seventh switches each connected in series to a corresponding one of the plurality of current sources.

9. The frequency comparator of claim 8, wherein, as a current output from the capacitor circuit is supplied to the power supply terminal or ground terminal via the current sources according to an operation of the seventh switches, the first frequency range of the reference voltage output from the capacitor circuit varies, and the second frequency range of the comparison target voltage varies.

10. The frequency comparator of claim 1, wherein the reference signal is a first reference signal, the comparator further comprising a reference signal generation unit that generates a second reference signal having a reference frequency based on an externally input signal and outputs the second reference signal to the pulse generation unit.

11. The frequency comparator of claim 1, further comprising a register unit that stores the comparison result signal output from the voltage comparison unit,
wherein the register unit stores the comparison result signal during a preset time, and outputs the stored comparison result signal in a parallel data form after a lapse of the preset time.

12. The frequency comparator of claim 1, wherein the first and second capacitor units are charged when the operation signal has a logical high value.

13. A frequency comparator comprising:
a reference signal generation unit that generates a first reference signal having a reference frequency based on an externally input signal and outputs the first reference signal to a pulse generation unit;
the pulse generation unit that outputs a comparison target signal and a second reference signal that is a pulse-form signal corresponding to the first reference signal;
a capacitor unit including:
an operator performing a logical NOR operation on the second reference signal and the comparison target signal to output an operation signal, the operation signal being a result of the NOR operation of the second reference signal and the comparison target signal; and
a plurality of first capacitors and a plurality of second capacitors, the first capacitors and the second capacitors being charged according to the operation signal, the first capacitors being discharged according to the second reference signal output from the pulse generation unit to output a reference voltage, the second capacitors being discharged according to the comparison target signal output from the pulse generation unit to output a comparison target voltage; and
a voltage comparison unit that compares the reference voltage and the comparison output voltage, which are output from the capacitor unit, to output a comparison result signal,
wherein the plurality of first capacitors are connected in parallel with each other, and a first frequency range of the reference voltage varies as the first capacitors are charged or discharged, and the plurality of second capacitors are connected in parallel with each other, and a second frequency range of the comparison target voltage varies as the second capacitors are charged or discharged.

14. The frequency comparator of claim 13, wherein the capacitor unit further includes:
a plurality of first switches each connected in series to a corresponding one of the first capacitors; and
a plurality of second switches each connected in series to a corresponding one of the second capacitors.

15. The frequency comparator of claim 14, wherein the capacitor unit further includes:
a third switch coupled to and disposed between a power supply terminal and the first capacitors, and charging a voltage corresponding to the second reference signal in the first capacitors in accordance with the operation signal;
a fourth switch coupled to and disposed between the power supply terminal and the second capacitors, and charging a voltage corresponding to the comparison target signal in the second capacitors in accordance with the operation signal;
a fifth switch that operates in accordance with the second reference signal output from the pulse generation unit and provides a discharge path of the voltage charged in the first capacitors; and
a sixth switch that operates in accordance with the comparison target signal output from the pulse generation unit and provides a discharge path of the voltage charged in the second capacitors.

16. The frequency comparator of claim 15, wherein the first and second capacitors are charged to a level of the power supply terminal.

17. The frequency comparator of claim 14, further comprising a current source/sink unit supplying or drawing a current to or from the capacitor unit.

18. The frequency comparator of claim 17, wherein the current source/sink unit comprises a current sink unit including a plurality of current sources each connected to a power supply terminal or ground terminal, and a plurality of seventh switches each connected in series to a corresponding one of the plurality of current sources.

19. The frequency comparator of claim 13, wherein the capacitor unit further comprises a leakage current compensator compensating for a leakage current component.

20. The frequency comparator of claim 13, wherein the first and second capacitors are charged when the operation signal has a logical high value.

* * * * *